United States Patent
Gu et al.

(10) Patent No.: US 11,237,280 B2
(45) Date of Patent: Feb. 1, 2022

(54) RADIATION IMAGE DETECTOR

(71) Applicant: IRAY TECHNOLOGY COMPANY LIMITED, Shanghai (CN)

(72) Inventors: Tieer Gu, Shanghai (CN); Zhongshou Huang, Shanghai (CN)

(73) Assignee: IRAY TECHNOLOGIES COMPANY LIMITED, Shanghai (CN)

( * ) Notice: Subject to any disclaimer, the term of this patent is extended or adjusted under 35 U.S.C. 154(b) by 0 days.

(21) Appl. No.: 16/936,616

(22) Filed: Jul. 23, 2020

(65) Prior Publication Data

US 2021/0223412 A1 Jul. 22, 2021

(30) Foreign Application Priority Data

Jan. 21, 2020 (CN) .......................... 202010072678.6

(51) Int. Cl.
*H01L 27/146* (2006.01)
*G01T 1/20* (2006.01)

(52) U.S. Cl.
CPC ...... *G01T 1/20181* (2020.05); *G01T 1/20185* (2020.05); *H01L 27/14625* (2013.01)

(58) Field of Classification Search
CPC ............. G01T 1/20181; G01T 1/20185; H01L 27/14625
See application file for complete search history.

(56) References Cited

U.S. PATENT DOCUMENTS

| | | | |
|---|---|---|---|
| 6,302,599 B1 * | 10/2001 | Stoebe | G03B 17/50 396/575 |
| 8,519,338 B2 | 8/2013 | Barrett et al. | |
| 9,606,244 B2 | 3/2017 | Ganguly et al. | |
| 2008/0031418 A1 | 2/2008 | Tseng | |
| 2014/0239183 A1 * | 8/2014 | Yamazaki | G01T 1/2018 250/361 R |

OTHER PUBLICATIONS

European Search Report dated Feb. 25, 2021 in EP 20196836.9.

* cited by examiner

*Primary Examiner* — Mark R Gaworecki
(74) *Attorney, Agent, or Firm* — W&G Law Group

(57) ABSTRACT

Provided is a radiation image detector, including: a substrate; a continued radiation conversion layer configured to convert radiation into visible light; an optical image detector on the substrate and between the radiation conversion layer and the substrate, wherein the optical image detector comprises an array of photosensitive pixels; a light-shielding structure located on a side of the plurality of photosensitive pixels facing away from the substrate, wherein the light-shielding structure has a plurality of openings to allow the visible light to reach the photosensitive pixels; and a light-collecting structure located between the radiation conversion layer and the light-shielding structure and comprising a plurality of convex lenses, wherein each convex lens has its optical axis perpendicular to the light-shielding structure and passing through one of the plurality of openings.

9 Claims, 9 Drawing Sheets

RADIATION IMAGE DETECTOR

CROSS-REFERENCE TO RELATED APPLICATIONS

The present disclosure is based upon and claims the benefit of priority of Chinese Patent Application No. 202010072678.6, filed on Jan. 21, 2020, the entire content of which is incorporated herein by reference.

TECHNICAL FIELD

The present disclosure pertains generally to the field of image detection technologies, and more particularly, to the field of radiation image detectors.

BACKGROUND

Flat-panel radiation image detectors have been widely used in digital radiography for digital medical diagnosis and radiation therapy. The flat-panel image detector has advantages of fastness, low cost, low exposure, high image quality, etc., is convenient for data archiving, transmission and image processing, and is readily integrated into PACS (Picture Archiving and Communication Systems). With development of technologies, dynamic X-ray imaging has become possible, which not only can be used in large-scale medical imaging applications such as chest fluoroscopy and cardiovascular dynamic X-ray imaging, but also has been gradually applied into small-area imaging and diagnostic applications such as dentistry.

The flat-panel radiation image detectors can be roughly divided into two types of detectors according to a detection principle and structures thereof, which include a direct conversion type of detector and an indirect conversion type of detector. The indirect conversion type of detector mainly includes a radiation conversion layer and an optical image detector. The radiation conversion layer can convert radiation into visible light. The optical image detector includes a plurality of photoelectric conversion devices. After the visible light is received by the photoelectric conversion device, electron-hole pairs are generated. After being separated under an action of an electric field, the electron-hole pairs respectively move towards an anode and a cathode of the photoelectric conversion device and then are collected. Thereafter, an electrical signal is generated and readout by an external circuit, thereby achieving detection of an image.

For the existing indirect conversion type of detector, the radiation is converted into visible light by means of the radiation conversion layer. When the visible light arrives at a film layer where the photoelectric conversion device is located, there may be a deviation for a position at which the visible light has arrived, which not only fails to contribute to the image, but also causes a decrease in a spatial resolution of the image or a contrast of the image, thereby affecting a quality of the image.

SUMMARY

Embodiments of the present disclosure provide a radiation image detector, aiming to solve problems of a low spatial resolution or a low contrast of an image and a poor quality of the image in the related art.

An embodiment of the present disclosure provides a radiation image detector, including: a substrate; a continued radiation conversion layer configured to convert radiation into visible light; an optical image detector on the substrate and between the radiation conversion layer and the substrate, wherein the optical image detector comprises an array of photosensitive pixels; a light-shielding structure located on a side of the plurality of photosensitive pixels facing away from the substrate, wherein the light-shielding structure has a plurality of openings to allow the visible light to reach the photosensitive pixels; and a light-collecting structure located between the radiation conversion layer and the light-shielding structure and comprising a plurality of convex lenses, wherein each convex lens has its optical axis perpendicular to the light-shielding structure and passing through one of the plurality of openings.

The radiation image detector provided by the embodiments of the present disclosure has the following beneficial effects. The convex lens in the light-collecting structure can guide the small-angle light, which is above the convex lens and close to the optical axis, to the opening of the light-shielding layer. The light passes through the opening and then enters the photosensitive pixel below. The light that has a large angle with respect to the optical axis will be shielded by the light-shielding layer after passing through the light-collecting structure, and thus cannot enter the photosensitive pixel to contribute to the image signal. The cooperation of the light-shielding structure and the light-collecting structure is equivalent to an optical collimator, which can collimate the visible light emitted from the radiation conversion layer, and shield the large-angle light, which can avoid a deviation of a position of the photosensitive pixel at which the visible light is incident and thus alleviate crosstalk, thereby increasing the image resolution and improving the image quality. In addition, by adjusting a structure of the optical collimator, the maximum solid angle at which the light collected by the photosensitive pixel deviates from the optical axis can be defined. That is, a collimation effect of the optical collimator formed by the convex lens and the opening of the light-shielding layer can be adjusted, in such a manner that an amount of visible light that enters the photosensitive pixel through the opening can be controlled. Then, according to different application requirements and characteristics of materials of the scintillator, a balance can be achieved between the DQE at the low spatial frequency and the DQE at the high spatial frequency of the image detection system.

BRIEF DESCRIPTION OF DRAWINGS

These and other features, aspects, and advantages of the present disclosure will become better understood when the following description is read with reference to the accompanying drawings in which like characters represent like parts throughout the drawings, wherein.

DESCRIPTION OF EMBODIMENTS

In order to make the features, aspects and advantages of the present disclosure better understood, the technical solutions of the present disclosure will be described in details below with reference to the accompanying drawings. It should be noted that the described embodiments are merely a part of implementations of the present disclosure, rather than all of the implementations or varieties based upon the concept disclosed in the present disclosure. All other embodiments obtained by those skilled in the art without creative efforts according to the embodiments of the present disclosure shall fall within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
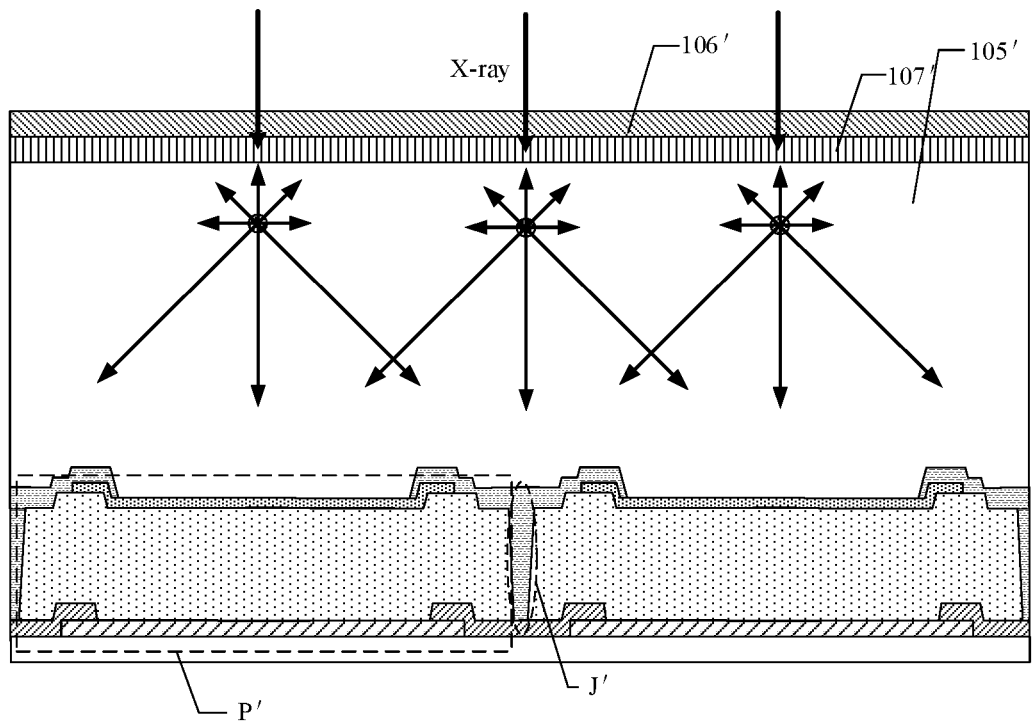
FIG. 1 is a prior art example of a typical flat panel radiation image detector.

FIG. 1 illustrates a prior art example of a typical flat panel radiation image detector. In FIG. 1, two photosensitive pixels P', a gap J' between the two photosensitive pixels P', and a radiation conversion layer 105' are illustrated. A carrier plate 106' and a reflective film 107' are also illustrated. An incident radiation (X-ray) sequentially passes through the carrier plate 106' and the reflective film 107' and then enters the radiation conversion layer 105'. Photon radiation of visible light generated under an action of the radiation conversion layer 105' radiates toward all directions with equal probability. Light that radiates upwardly is reflected back by a top reflective film 107', and then has a same opportunity as photons that radiate downwardly to eventually enter the photosensitive pixel P', thereby generating an electrical signal of photo-generated electrons or holes. However, photons radiated from a light radiation point (a position where photons of visible light are generated) at a large radiation angle will not arrive at a photosensitive pixel P' disposed directly under them, but will enter a surrounding photosensitive pixel P', thereby causing crosstalk. The larger radiation angle (that is, an angle formed between a radiation direction and a direction perpendicular to the image detector) leads to that the photons may more likely arrive at the farther photosensitive pixel P', thereby achieving the greater blurring effect on details of the image. Photons radiated at a large angle, nearly being parallel with the radiation conversion layer 105', may undergo multiple scatterings during a long-distance transmission. This may increase a tortuous propagation path of the photons, and thus the photons may be gradually absorbed by scintillators in the radiation conversion layer and then disappear.

It is known from the above analysis that a part of visible light radiated at a large angle may deviate from an original pixel position, and an image signal generated by contribution of this part of visible light will be superimposed on an original image signal of an adjacent pixel, which may result in crosstalk or blurring for the image, thereby decreasing a modulation transfer function (MTF) of the image. Further, when radiation that is to generate photons is absorbed at a position closer to the top of the radiation conversion layer (a side to which the radiation is incident), a lateral radiation component of the photons will have the more significant effect on spreading of a light spot (the pixel position, where the photons radiated at a large angle arrive, is father from the original pixel position), thereby leads to the greater attenuation effect on the MTF of the image. Moreover, an intensity of the radiation incident into the scintillator decays exponentially along a penetration depth. That is, the larger output amount of light at the top of the radiation conversion layer leas to the more significant degradation effect on the MTF of the image.

The penetration depth of the radiation incident to the radiation conversion layer is related to energy of the radiation itself and a damping effect of the radiation conversion layer on the radiation. There may be visible light generated by an action of the radiation ray and the scintillator at different positions in a thickness direction of the radiation conversion layer. That is, increasing the thickness of the radiation conversion layer can increase an output amount of photons. The radiation conversion layer needs to have a greater thickness, in order to obtain a higher radiation conversion efficiency. Decreasing the thickness of the radiation conversion layer can shorten a propagation distance of visible light radiated at a large angle, thereby alleviating an image crosstalk to a certain extent. The two parameters, i.e., the radiation conversion efficiency and the MTF of the image, have contradictory requirements on a structure of the detector, which limits optimization of a performance of the detector.

In order to increase the MTF of the image, a technical solution in the related art lies in that the radiation conversion layer is formed by a non-crystal scintillator, such as cesium iodide CsI (Tl) or CsI (Na). A columnar crystal structure with a guiding effect on the visible light is formed by evaporation at a certain angle or by using tiny periodic convex structures on a substrate. Most visible light emitted from the light radiation point is guided into the photosensitive pixel disposed directly under it. However, the scintillator formed by evaporation in such a technical solution is extremely sensitive to humidity and temperature, thereby affecting performance stability of the image detector. Moreover, such a forming method also has certain restrictions on a type of the scintillator crystal.

Another technical solution in the related art lies in that a fiber optical plate (FOP) with a collimating effect is formed between a photosensitive pixel array and the radiation conversion layer. By merely extracting vertical rays emitted from the radiation conversion layer, the rays that cause crosstalk between adjacent pixel images can be effectively filtered out. However, the FOP itself has a certain opening ratio, and a black isolation layer between the optical fibers absorbs a part of the effective visible light, which has a certain impact on a photoelectric conversion efficiency. In addition, it is very difficult to manufacture an FOP having a larger dimension, which limits its application. Currently, the FOP can be only applied to a small camera chip, such as a charge coupled device (CCD) or a CMOS imaging sensor (CIS).

Based on the problems in the related art, embodiments of the present disclosure provide a radiation image detector, which can be applied to various types of scintillator crystals, thereby alleviating crosstalk, increasing the MTF of the image, or increasing a detective quantum efficiency (DQE) at a high spatial frequency.

Figure 2:
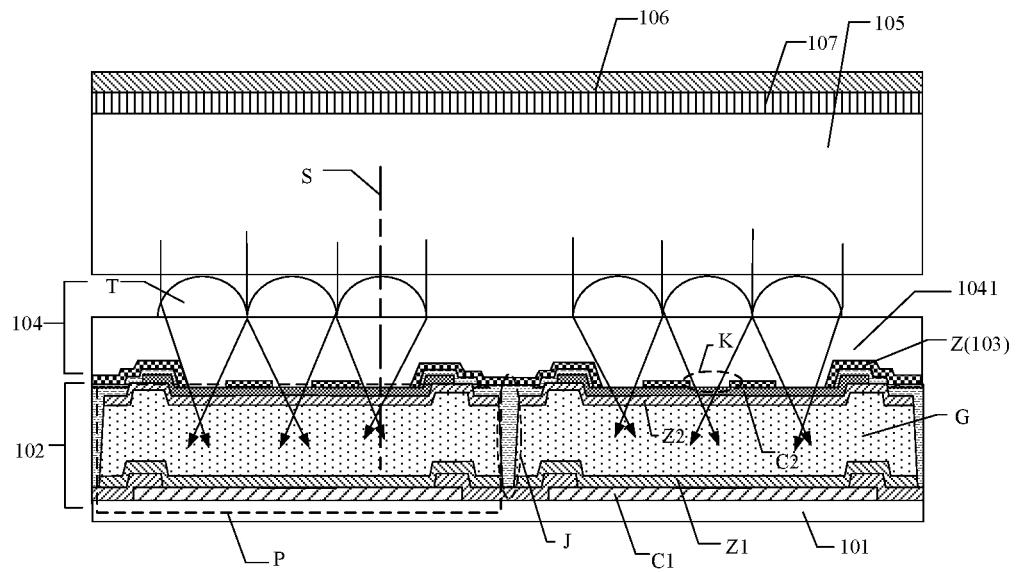
FIG. 2 is a cross-sectional view of a portion of a radiation image detector according to an embodiment of the present disclosure.
Figure 3:
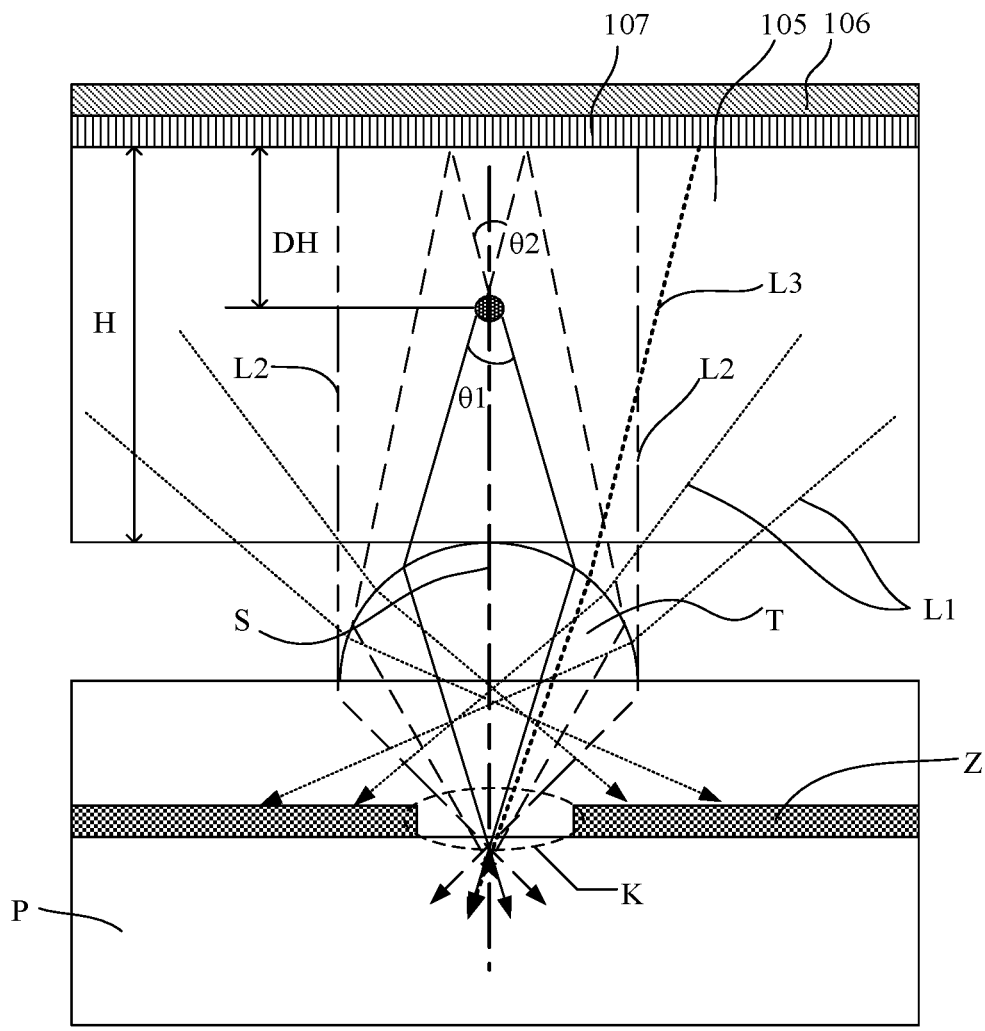
FIG. 3 is a schematic illustrating a principle of an embodiment of the present disclosure.

FIG. 2 is a cross-sectional view of a portion of a radiation image detector according to an embodiment of the present disclosure. FIG. 3 is a schematic illustrating a principle of an embodiment of the present disclosure.

As shown in FIG. 2, the radiation image detector includes: a substrate 101, an optical image detector 102; a light-shielding structure 103 that is pixelated; a light-collecting structure 104 that is pixelated; and a continued radiation conversion layer 105.

The substrate 101 may be made of a rigid material or a flexible material.

The optical image detector 102 is arranged on the substrate 101. The optical image detector 102 includes an array of photosensitive pixels P arranged periodically. Moreover, adjacent photosensitive pixels P are isolated from each other by etching or by means of an insulation film, thereby avoiding signal crosstalk between pixels and interference noise of driving pulses. Therefore, a trench region J exists between adjacent photosensitive pixels P. In an example, the photosensitive pixel P includes a photoelectric conversion device, and the photoelectric conversion device may be a photodiode. As illustrated, the photosensitive pixel includes a first electrode C1, a first doped layer Z1, a photoelectric conversion layer G, a second doped layer Z2, and a second electrode C2 that are sequentially stacked on the substrate 101. When the first electrode is an anode, the first doped layer is a p-type doped layer, the second electrode is a cathode, and the second doped layer is an n-type doped layer. When the first electrode is a cathode, the first doped layer is an n-type doped layer, the second electrode is an anode, and the second doped layer is a p-type doped layer.

The light-shielding structure 103 that is pixelated is located on a side of the photosensitive pixel P facing away from the substrate 101. The light-shielding structure 103 includes at least one light-shielding layer Z, and each light-shielding layer Z includes at least one opening K. Although only one light-shielding layer Z is illustrated, the present disclosure has no specific limitation on the number of openings K in one light-shielding layer Z. The pixelated light-shielding structure means that each photosensitive pixel P corresponds to a light-shielding structure 103.

The light-collecting structure 104 that is pixelated is located on a side of the light-shielding structure 103 facing away from the photosensitive pixel P. The light-collecting structure 104 includes at least one convex lens T having, and an optical axis S of the convex lens T is perpendicular to the light-shielding layer Z and passes through the opening K.

The pixelated light-collecting structure means that each photosensitive pixel P corresponds to a light-collecting structure 104.

As a simple and easy-to-manufacture pixel structure, for the array of photosensitive pixels, each photosensitive pixel corresponds to the same light-shielding structure and the same light-collecting structure.

The radiation conversion layer 105 is located on a side of the light-collecting structure 104 facing away from the light-shielding structure 103, and is configured to convert radiation into visible light. The radiation may be X-rays having radiation energy ranging from 1 KeV to several hundred KeV, or γ (Gamma)-rays which may have higher energy exceeding 1 MeV in energy distribution. The radiation conversion layer 103 includes scintillator or phosphors, such as cesium iodide (doped with Thallium CsI (Tl), or $CdWO_4$ or GOS ($Gd_2O_2S$:Pr).

The light-collecting structure 104 is configured to guide the visible light, which is emitted from the radiation conversion layer 105 and close to an optical axis S, to the opening K. The optical axis S is the optical axis of the convex lens T, and thus in this embodiment of the present disclosure, the opening K corresponds to the convex lens T. In this embodiment of the present disclosure, the visible light, which is emitted from the radiation conversion layer 105 and close to the optical axis S, is construed as a part of visible light emitted from the radiation conversion layer 105 and having a small angle with respect to the optical axis S. This part of visible light is guided by the light-collecting structure 104 to the opening K.

In an example, as shown in FIG. 2, the radiation image detector further includes a cover plate 106 and a reflective layer 107. The reflective layer 107 is located on a side of the radiation conversion layer 105 facing away from the optical image detector 102, and the cover plate 106 is located on a side of the reflective layer 107 facing away from the radiation conversion layer 105. The cover plate 106 is made of light mass materials including a material that can be easily penetrated by radiation, such as a carbon fiber thin plate or an aluminum alloy plate. The reflective layer 107 is made of materials with high reflection effect for visible light, such as aluminum or silver in the forms of thin film or nano particles.

A principle of this embodiment of the present disclosure will be described with reference to FIG. 3, which is simplified for illustration. The radiation conversion layer 105 has a thickness of H. The incident radiation is converted into visible light at a position of a depth DH in the radiation conversion layer 105. Among the visible light radiated toward all directions, light radiated downward and being within a cone-shaped solid angle θ1 can pass through the opening K of the light-shielding layer Z under an action of the convex lens T, and finally enters the photosensitive pixel P. The visible light is guided to the opening K, and thus the opening K is equivalent to an aperture. The light radiated upward and being within a cone-shaped solid angle θ2 is reflected by the reflective layer 107, then sequentially passes through the convex lens T and the opening K of the light-shielding layer Z, and finally enters the photosensitive pixel P. After passing through the light-collecting structure 104, light L1 having a large angle with respect to the optical axis S will be shielded by the light-shielding layer Z. That is, the convex lens in the light-collecting structure can guide the small-angle light, which is above the convex lens and close to the optical axis, to the opening of the light-shielding layer, and the light passes through the opening and then enters the photosensitive pixel below. The light that has a large angle with respect to the optical axis will be shielded by the light-shielding layer after passing through the light-collecting structure, and thus cannot enter the photosensitive pixel for contributing to the image signal. The cooperation of the light-shielding structure and the light-collecting structure is equivalent to an optical collimator, which can collimate the visible light emitted from the radiation conversion layer, block the large-angle light, and avoid a deviation of a position of the photosensitive pixel at which the visible light is incident, thereby alleviating crosstalk and thus increasing the image resolution and improving the quality of the detected image.

Further, with further reference to FIG. 3 described above, dimensions of the solid angle θ1 and the solid angle θ2 are not only related to DH and H, but also related to a diameter of the convex lens T, an area of the opening K, and a relative distance between the opening K and the convex lens T. By adjusting the area of the opening K and the relative distance between the convex lens T and the opening K, a maximum solid angle at which the light collected by the photosensitive pixel deviates from the optical axis can be defined. As shown in FIG. 3, the light directly above the convex lens T within a cylindrical space formed by the light L2 parallel to the optical axis S and having a certain angle with respect to the optical axis S can be guided by the convex lens T to the opening K. When the thickness H of the radiation conversion layer 105 is sufficiently large, the light outside the cylindrical space formed by the light L2 parallel to the optical axis S, such as light L3, can also be guided by the convex lens T to the opening K. The light L3 may come from the radiation conversion layer corresponding to the surrounding photosensitive pixel. By adjusting a dimension of the opening K and the distance between the opening K and the convex lens T, the light L3 can be prevented from being guided to the opening K. That is, an angle of the light that is incident to the opening K can be adjusted in such a manner that an amount of light entering the photosensitive pixel is controlled.

In an embodiment, when the convex lens in the light-collecting structure is a spherical convex lens, the light-shielding layer is located on a side of a spherical center of a spherical surface facing away from the radiation conversion layer. In this way, an optical focal point of the convex lens, i.e., a position at which the light parallel to the convex lens is focused by the convex lens, is located on the side of the spherical center of the spherical surface facing away from the radiation conversion layer. This can prevent the light after the action of the convex lens from being shielded by the light-shielding layer again at a position of passing through the optical focal point, which would otherwise result in light loss.

In some implementations, the light-shielding layer includes an opaque metal layer, and the metal layer includes a chromium layer or a chromium layer covered by chromium oxide. At least one metal layer is used to provide a driving voltage to the photosensitive pixel.

When the light-shielding layer includes a chromium layer, the chromium layer is electrically connected to an electrode of the photosensitive pixel close to the radiation conversion layer. The electrode may be a transparent electrode, such as indium tin oxide (ITO), so that the light-shielding layer can provide a driving voltage to the photosensitive pixel, thereby improving a conductive performance of the transparent electrode.

When the light-shielding layer includes a chromium layer covered by chromium oxide, the chromium layer is electrically connected to the electrode of the photosensitive pixel close to the radiation conversion layer, so that the light-shielding layer can provide a driving voltage to the photosensitive pixel, thereby improving the conductive performance of the transparent electrode. Meanwhile, the chromium oxide has a light-absorption performance, which can prevent light that has a large angle and is incident to the light-shielding layer from being reflected.

In an embodiment, the light-shielding layer may be a combined film layer, which includes an organic black light-shielding film doped with carbon powders and an inorganic thin film. The organic black light-shielding film covers the inorganic thin film made of silicon oxide or silicon nitride, to form the combined film layer. This can prevent a photodiode disposed under the light-shielding layer from being damaged by a manufacturing process of the upper thin film while shielding the light. For example, this can prevent solvent released during the manufacturing process of the organic film from affecting the photodiode.

With further reference to FIG. 2 described above, the light-collecting structure 104 further includes a base layer 1041. The base layer 1041 can not only serve as a base for carrying the convex lens T, but also can planarize a surface of the array of photosensitive pixels below. The base layer 1041 may be made of a material that is the same as the material of the convex lens T or may be made of a material having substantially the same refractive index, so as to decrease reflection when visible light passes through an interface of the film layer. The material of the base layer 1041 includes any one of polyimide, polyethylene terephthalate, and acrylic resin.

In a manufacturing process, an organic film containing solvent may be first formed on the array of photosensitive pixels, and then the solvent in the organic film is volatilized by baking or UV curing, so as to form the base layer 1041. Then the convex lens is formed on the base layer 1041. The convex lens may be formed by an etching process. First, an organic thin film is manufactured, and the organic thin film is etched at a position corresponding to the convex lens to form a step-like structure, which is then baked at a high temperature, so that an edge of the step-like structure forms an arc shape due to a softened fluidity of the organic material film, thereby forming a structure of the convex lens. In this manufacturing process, the base layer and the convex lens are manufactured separately. In another manufacturing process, the convex lens and the base layer can be manufactured in a single process through a half-grayscale photo mask.

According to the above description of the principle, it is known that in this embodiment of the present disclosure, the optical collimator formed by the cooperation of the light-shielding structure and the light-collecting structure can allow the small-angle light that is close to the optical axis S and directly above the convex lens T to be collected and then enter the photosensitive pixel, thereby contributing to the image signal. However, a part of the large-angle light that is emitted from the light radiation point located directly above the convex lens T may not be collected, thereby resulting in loss of optical signals. As a result, the detective quantum efficiency (DQE) at a low special frequency will be decreased, and the DQE at a high special frequency will be greatly increased. A principle of increasing the MTF of the detection system and increasing the DQE at a high spatial frequency will be described in the following.

Figure 4:
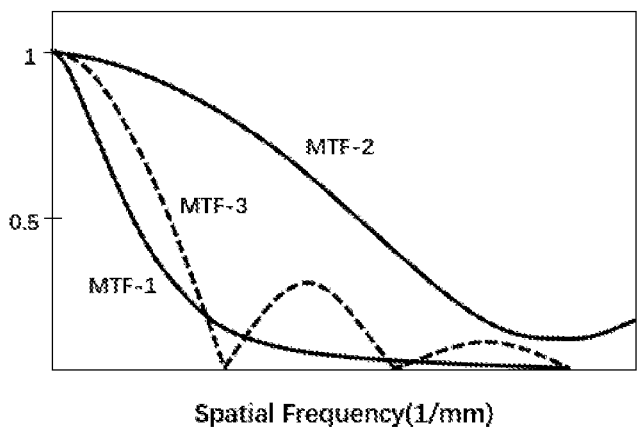
FIG. 4 illustrates an MTF simulation curve I obtained by an experiment according to the present disclosure.

FIG. 4 illustrates an MTF simulation curve I obtained by an experiment of the present disclosure. As shown in FIG. 4, an abscissa represents a spatial frequency (1/mm), and an ordinate represents a spatial modulation transfer function MTF. Here, MTF-1 represents a MTF of a scintillator without a convex lens array, MTF-2 represents a MTF of a scintillator provided with a convex lens and opening of the light-shielding layer, and MTF-3 represents an SINC function of a pixel electrode of the detector.

MTF-3 represents a MTF of the pixel electrode of the detector array (the array of photosensitive pixels). It can be seen that MTF-3 is a characteristic of a typical SINC function, that is, a characteristic of [Sin(x)/x]^2. This curve has a first zero point at a spatial frequency of an inverse of a width of the pixel electrode, i.e., at a spatial sampling frequency of the array of photosensitive pixels.

MTF-1 represents the MTF of an isotropic scintillator (i.e., a radiation conversion layer) having a certain thickness. It can be seen that the MTF of the radiation conversion layer decays rapidly with an increase of the spatial frequency. This feature expresses that, in a structure without anisotropy, e.g., in a scintillator composed of amorphous cesium iodide, light will be distributed isotropically to the surroundings under an action of the scintillator.

MTF-2 represents the MTF of the scintillator provided with the convex lens and the opening of the light-shielding layer. In a pixel structure model used in calculation simulation, the light-shielding structure and the light-collecting structure are provided above each photodiode. A total of 3*3=9 convex lenses are provided in the light-collecting structure, and correspondingly, 9 openings corresponding to the convex lenses are provided in the light-shielding layer of the light-shielding structure. That is, there are three separate detection units corresponding to the convex lenses in one direction of a detection plane thereof. As shown by the curve in the figure, MTF-2 presents a shape of the SINC function to some extent, but its spatial sampling frequency is approximately equal to three times the spatial sampling frequency of the photodiode. It can be understood according to the principle shown in FIG. 3, there are three separate detection units corresponding to the convex lenses in one direction of the detection plane. Adjacent convex lenses will share a group of photons emitted from a same light radiation point to a certain extent. Therefore, at the spatial frequency of an inverse of the diameter of the convex lens, i.e., at a repetition frequency of the convex lens in a one-dimensional space, the MTF has a minimum value which is not zero. In other words, MTF-2 does not have a zero point like MTF-1.

The MTF-2 curve in FIG. 4 has confirmed the above explanation of the principle corresponding to FIG. 3. After providing the light-collecting structure (at least one convex lens) and the light-shielding structure (at least one opening corresponding to the convex lens), small-angle light that is emitted from the radiation conversion layer directly opposite to the convex lens and is close to the optical axis will be guided to the opening, and then enters the photosensitive pixel. The large-angle light that is far from the optical axis will be shielded by the light-shielding layer. In this way, crosstalk can be alleviated, and the MTF of the image can be increased.

The radiation image detector serves as a detection system, and the MTF of the system is determined by a product of a MTF of a photodiode array (i.e., the array of photosensitive pixels) and a MTF of the scintillator. Thus, it can be achieved that MTF$_{SYS}$=MTF$_3$×MTF$_2$, where MTF$_{SYS}$ represents an MTF of the entire detection system, MTF$_3$ represents the MTF of the array of photosensitive pixels, and MTF$_2$ represents the MTF of the scintillator. In combination with the curve shown in FIG. 4 and illustration of a simulation experiment, the curve of the MTF-2 is obtained in the simulation experiment by taking a scintillator provided with the convex lens and the opening of the light-shielding layer as an entirety. The above formula is applied in this embodiment of the present disclosure, and MTF$_2$ represents the MTF of the scintillator provided with the convex lens and the opening of the light-shielding layer. In this embodiment of the present disclosure, the MTF$_2$ is significantly increased, and it can be seen that the MTF of the entire detection system can also be significantly increased.

Further, a comprehensive image detection capability of the radiation image detector provided in this embodiment of the present disclosure, i.e., the detective quantum efficiency DQE, has been verified by a simulation experiment. The comprehensive image detection capability of the image detector is determined by the detective quantum efficiency DQE. A DQE of a detection system is defined as a square of a ratio of an output signal-to-noise ratio to an input signal-to-noise ratio. In a case of an extreme quantum noise, in which a quantum scatter noise power of an input X-ray far exceeds an electronic noise power of the detector system, it can also be simplified as a product of a DQE at a zero spatial frequency and a square of the MTF of the system MTF, which is shown as $$DQE_{SYS} = \left[\frac{(S/N)_{OUT}}{(S/N)_{IN}}\right]^2 = DQE(0) \cdot MTF^2 \cdot \frac{NPS_{IN}}{NPS_{OUT}} \approx DQE(0) \cdot MTF^2,$$

where DQE$_{SYS}$ represents the detective quantum efficiency of the image detector system, NPS represents an equivalent noise power, a subscript IN represents an input parameter, and a subscript OUT represents an output parameter. According to the above formula, the detective quantum efficiency of the image detector system is related to the MTF of the detection system.

Figure 5:
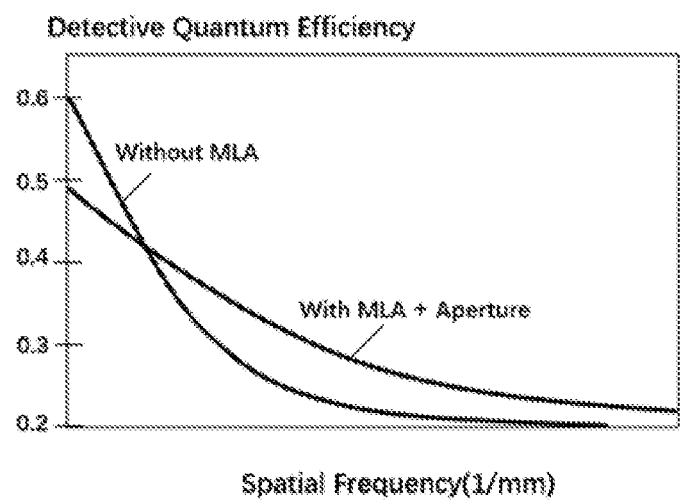
FIG. 5 illustrates a DQE simulation curve II obtained by an experiment according to the present disclosure.

FIG. 5 illustrates a DQE simulation curve II obtained by an experiment of the present disclosure. An abscissa represents a spatial frequency (1/mm), and an ordinate represents a detective quantum efficiency DQE. As shown in FIG. 5, in a low spatial frequency domain, a detective quantum efficiency of a system provided with the light-collecting structure and the light-shielding structure is smaller than a detective quantum efficiency of a system without the light-collecting structure and the light-shielding structure. This may because the optical collimator (formed by the convex lens and the opening in the light-shielding layer in this implementation of the present disclosure) illustrated in the principle in FIG. 3 described above shields a part of the large-angle light. However, since the MTF of the system is greatly increased, the detective quantum efficiency at a high spatial frequency of the system is significantly increased. Therefore, the radiation image detector according to the embodiment of the present disclosure can improve the capability of the detection system for identifying image details. Such optimization and adjustment of the performance of the system is very effective and valuable for various medical diagnostic applications that require for extracting X-ray image details.

In the related art, it is difficult to choose between two contradictory technical parameters: increasing the thickness of the scintillator (that is, the radiation conversion layer of the present disclosure) so as to increase the output amount of photons; and decreasing the thickness of the scintillator so as to improve a resolution of the image (i.e., to increase the MTF). The embodiment of the present disclosure provides an effective way to optimize detection function indicators (MTF, DQE, etc.) of the system, so as to meet various requirements for image detection during medical diagnosis or radiation treatment.

Further, a relationship between an opening diameter and the detective quantum efficiency of the system has been studied by taking a circular opening as an example.

Figure 6:
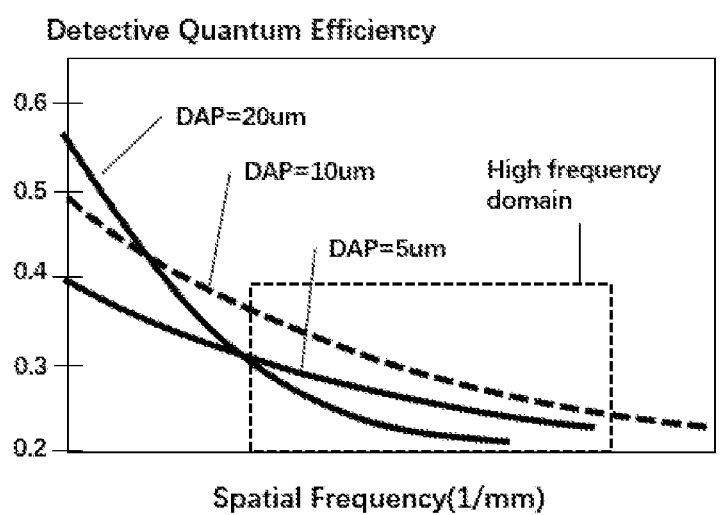
FIG. 6 illustrates a relationship between a DQE and spatial frequency of a system for different opening diameters obtained by simulation.

FIG. 6 illustrates a relation between a DQE and spatial frequency of a system for different opening diameters obtained by simulation. As shown in FIG. 6, an abscissa represents a spatial frequency (1/mm), and an ordinate represents a detective quantum efficiency DQE. DAP represents the opening diameter. The systems with DAP=5 μm, DAP=10 μm, and DAP=20 μm have been studied. In the system, the opening diameter may be different but all other parameters are the same. By comparing curves in the figure, it can be seen that in the low spatial frequency domain, the opening diameter is small, and DQE is small. In a domain close to a Nyquist frequency (the Nyquist frequency is equal to ½ of a sampling frequency), with a decrease of the opening diameter, DQE presents a non-monotonic change from increasing to finally decreasing. This is because when the opening diameter is small, a decrease in MTF caused by signal mixing between the photosensitive pixels may be negligible, and an optical signal obtained by each photosensitive pixel decreases monotonously with the decrease of the opening diameter; however, the scatter noise of the photons decreases according to a square root of a number of photons, so the signal-to-noise ratio is attenuated with the further decrease of the opening diameter. From the above simulation results, it is known that in a high spatial frequency domain or in a domain close to the Nyquist frequency, there may be a light opening having an optimal value, which allows the DQE in this domain to achieve a maximum value.

Figure 7:
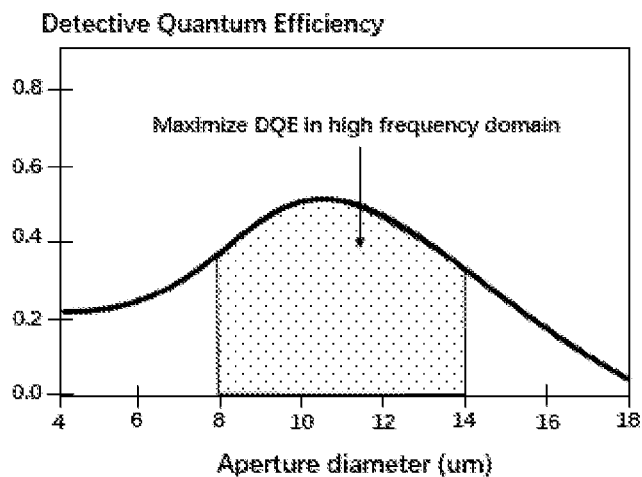
FIG. 7 illustrates a relation between a DQE and an opening diameter of a system obtained by simulation.

Further, the DQE of the system has been calculated by selecting one spatial frequency and using the opening diameter corresponding to the convex lens as a variable. FIG. 7 illustrates a relationship between a DQE and an opening diameter of a system. As shown in FIG. 7, for the selected spatial frequency, there is an optimal opening diameter or range, which allows the DQE of the system in this frequency domain to achieve the maximum value or to be maintained at a relatively high DQE value. The range of the opening diameter is different depending on a use of medical diagnosis, details of a human body part or object to be observed, the thickness and material characteristics of the used scintillator, a resolution of the photodiode array, the diameter of the convex lens, the relative distance between the convex lens and the opening, an accuracy of the manufacturing process, especially a photoetching process and a thin film curing process. That is, the range of the opening diameter that can maximize the DQE of the system is a complex function depending on various variables described above. For resolutions and dimension parameters of the commonly used scintillator and photoelectric detection, an opening diameter corresponding to a convex lens of an indirect conversion type of image detector has a minimum value of 1 μm and a maximum value that is approximately ⅔ of a diameter of the convex lens. When the light-shielding structure includes multiple light-shielding layers, the range of the opening diameter described above gives an optimal dimension range of the smallest opening among the multiple openings which overlap with each other in a direction perpendicular to the substrate.

According to the above analysis, it is known that in this embodiment of the present disclosure, the optical collimator formed by the light-collecting structure and the light-shielding structure is provided between the photosensitive pixel and the radiation conversion layer. The convex lens in the light-collecting structure can guide the small-angle light close to the optical axis to the opening of the light-shielding structure, and then the light enters the photosensitive pixel, thereby contributing to the image signal. The light-shielding layer can shield the large-angle light, thereby avoiding a deviation of a position of the photosensitive pixel at which the visible light is incident and thus alleviating the crosstalk. The large-angle light that can be shielded by the light-shielding layer includes not only the light emitted from the radiation conversion layer corresponding to the surrounding photosensitive pixels, but also a part of the large-angle light emitted from the radiation conversion layer disposed directly above the convex lens (i.e., large-angle light that is close to the optical axis of the convex lens). Loss of the optical signal of the large-angle light that is close to the optical axis of the convex lens results in a decrease of DQE at a low spatial frequency and an increase of DQE at a high spatial frequency. Therefore, in this embodiment of the present disclosure, by adjusting a structure of the optical collimator, the maximum solid angle at which the light collected by the photosensitive pixel deviates from the optical axis can be defined. That is, a collimation effect of the optical collimator formed by the convex lens and the opening in the light-shielding layer can be adjusted, in such a manner that an amount of visible light that enters the photosensitive pixel through the opening can be controlled. Then, according to different application requirements and characteristics of materials of the scintillator, a balance can be achieved between the DQE at the low spatial frequency and the DQE at the high spatial frequency of the image detection system.

In an embodiment, the radiation image detector further includes an anti-reflective coating on each convex lens. That is, the anti-reflective coating is provided between the light-collecting structure layer and the radiation conversion layer, so as to increase light transmittance of the convex lens. Since a refractive index of the material of the radiation conversion layer is different from a refractive index of the material of the convex lens, light reflection may occur at an interface therebetween. The anti-reflective coating is deposited on the surface of the convex lens, and a refractive index of the anti-reflective film is between the refractive index of the material of the radiation conversion layer and the refractive index of the material of the convex lens, so the light transmittance of the convex lens can be increased. In addition, the anti-reflective coating can allow harmful gas that may be released to be sealed at a side of the light-collecting structure, thereby avoiding an affection on stability of the material of the scintillator.

Figure 8:
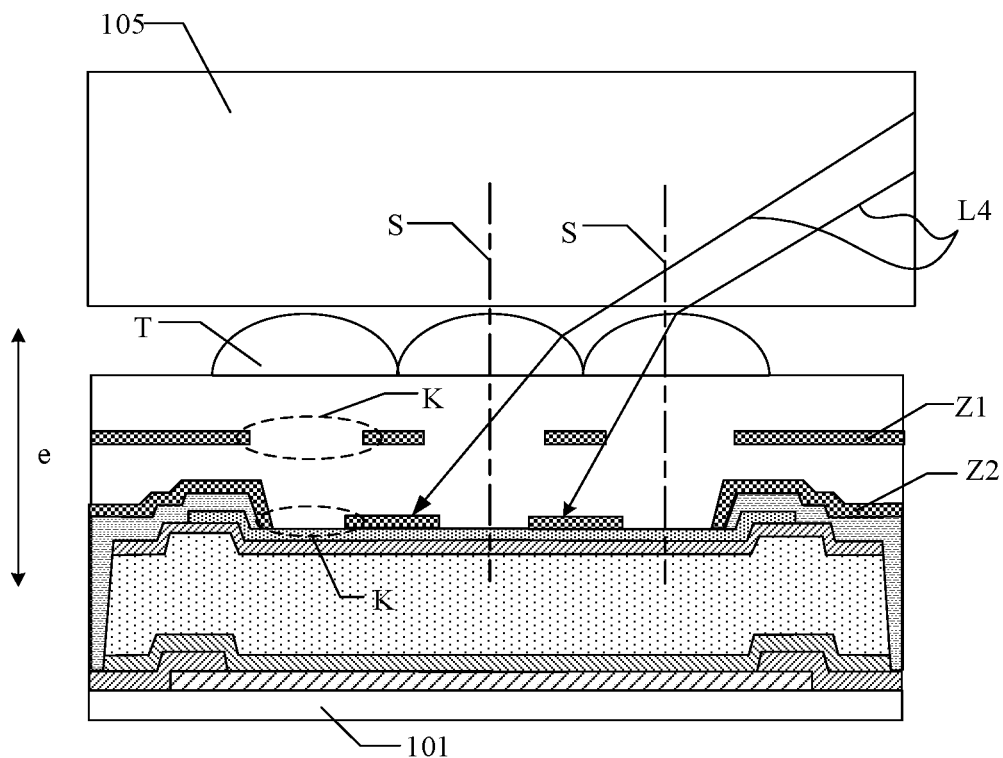
FIG. 8 is a cross-sectional view of a portion of a radiation image detector according to another embodiment of the present disclosure.

In this embodiment of the present disclosure, the light-shielding structure further includes N light-shielding layers overlapped in sequence on the photosensitive pixels, where N is an integer greater than or equal to 2. In an embodiment, the light-shielding structure includes two light-shielding layers, as shown in FIG. 8. FIG. 8 is a cross-sectional view of a portion of a radiation image detector according to another embodiment of the present disclosure. In FIG. 8, only one photosensitive pixel is shown for illustration. In the direction perpendicular to the substrate 101, each opening K overlaps with a respective one opening K in another light-shielding layer Z. At a position at which the openings overlap with each other, an area of the opening K close to the light-collecting structure 104 is greater than an area of the opening K far from the light-collecting structure 104. For example, FIG. 8 illustrates a light-shielding layer Z1 and a light-shielding layer Z2. Light L4 that has a large angle with respect to the optical axis S of the convex lens T and is emitted from the radiation conversion layer corresponding to the adjacent photosensitive pixel can pass through the convex lens, and then be incident to the photosensitive pixel below through the opening K of the light-shielding layer Z1. However, the light L4 will be shielded by the light-shielding layer Z2 and thus cannot enter the photosensitive pixel. The arrangement in this embodiment can achieve gradual collecting of incident visible light, thereby further ensuring limitation on the large-angle light and stray light by the optical collimator. In addition, the larger relative distance between two adjacent light-shielding layers can lead to the more obvious collimation effect on the light.

Figure 9:
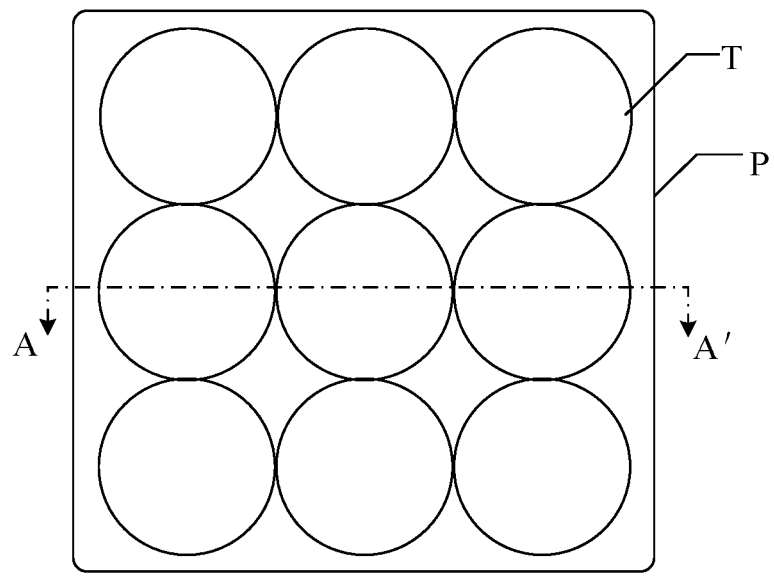
FIG. 9 is a top view of a portion of a radiation image detector according to another embodiment of the present disclosure.
Figure 10:
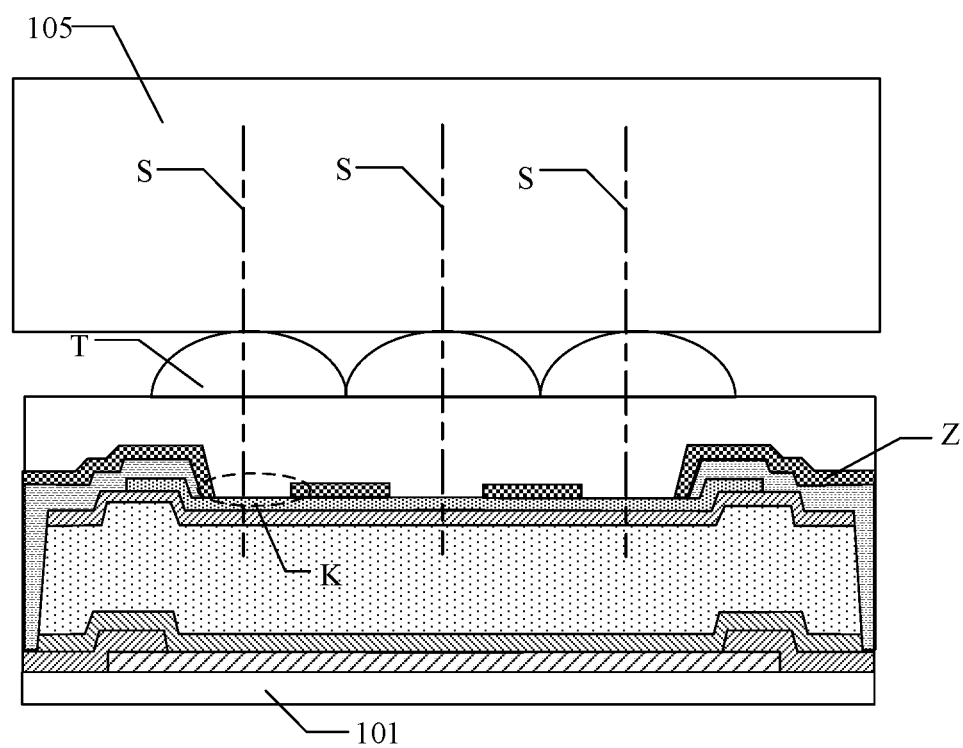
FIG. 10 is a cross-sectional view taken along line A-A' of FIG. 9.

In an embodiment, the light-collecting structure includes a lens array including M convex lenses arranged on a plane parallel to the photosensitive pixel. One lens array corresponds to one photosensitive pixel. M is an integer greater than or equal to 2. An optical axis of each convex lens passes through an opening corresponding thereto. This will be illustrated with reference to FIG. 9 and FIG. 10 described in the following. FIG. 9 is a top view of a portion of a radiation image detector according to another embodiment of the present disclosure. FIG. 10 is a cross-sectional view taken along line A-A' of FIG. 9. In an example, as shown in FIG. 9, M=9 and one photosensitive pixel P corresponds to nine convex lenses T. An optical axis S of each convex lens T passes through an opening K corresponding thereto. With such a design of the lens array, one photosensitive pixel corresponds to multiple convex lenses, so that when a dimension of the convex lens is much smaller than a dimension of the photosensitive pixel, excellent collimation of light can be achieved without considering a precise alignment of the convex lens and the photosensitive pixel during a manufacturing process. During the manufacturing process, a convex lens panel including the convex lens array and the light-shielding layer can be first manufactured, then a surface of the optical detector is covered by the convex lens panel, and then the convex lens panel is covered by a radiation lens conversion film or a radiation conversion plate. During the manufacturing process, the convex lens array and the light-shielding layer may also be manufactured on a flexible substrate to obtain a convex lens thin film, then a surface of the optical detector is covered by the convex lens thin film, and then the convex lens thin film is covered by a radiation conversion film or a radiation conversion plate. In this way, a manufacturing cost of the detector system can be reduced.

In addition, in the related art, there is a scheme in which a micro lens is provided above the photosensitive pixel to guide more light into the photodiode. However, the scheme in the related art lies in that the micro lens having a dimension substantially the same as that of the photosensitive pixel is provided above each photosensitive pixel, trying to allow all light above the photosensitive pixel to be guided into the corresponding photodiode of the photosensitive pixel, which can reduce light loss in an edge area of the photosensitive pixel. For a radiation image detector which is commonly used in medical applications, considering a large dimension of an image and a signal-to-noise ratio, a dimension of a pixel is usually greater than 50 μm. For a breast X-ray detector, a pixel is generally of 100 μm. For radiation ray diagnostic and medical image detectors used for cardiovascular, chest, and other body parts, the dimension of the pixel is usually 200 μm. According to a basic principle and design of optical lenses, whether it is a convex lens or a concave lens, a height of the lens should be an in a same order of magnitude or substantially the same as a diameter of the lens. The larger dimension of the lens leads to the more difficult manufacturing process. However, if it is desired to manufacture a convex lens having a height of 50 μm or even 100 μm on a substrate having a large dimension, such as a substrate of 200 mm*200 mm, there will be a great complexity and difficulty for the manufacturing process. In addition, the manufacturing process of the lens may have an unexpected adverse effect on the photoelectric conversion layer of the photosensitive pixel.

In this embodiment of the present disclosure, one convex lens array may be arranged above one photosensitive pixel. According to the dimension of the photosensitive pixel and the diameter of the convex lens, at least four or more convex lenses may be arranged above one photosensitive pixel. In an optional manufacturing method, an organic thin film is first coated, then a part of solvent is evaporated using UV curing, and the organic thin film is etched to form a step-like structure, which is then baked at a high temperature, so that an edge of the step-like structure forms an arc shape due to a softened fluidity of the organic material film layer, thereby forming a structure of the convex lens. A radius or a height of the convex lens may range from a few microns to a dozen microns depending on capabilities of the thin film coating process, UV curing or thermal curing, etching and the like. For detectors that have been widely applied in breast X-ray diagnosis, 16 convex lenses each having a diameter of 10 μm may be arranged above a pixel of 50 μm*50 μm. With the structure provided by this embodiment of the present disclosure, there is one convex lens array provided above each pixel. In this way, the manufacturing process is simple and the manufacturing is easy.

Figure 11:
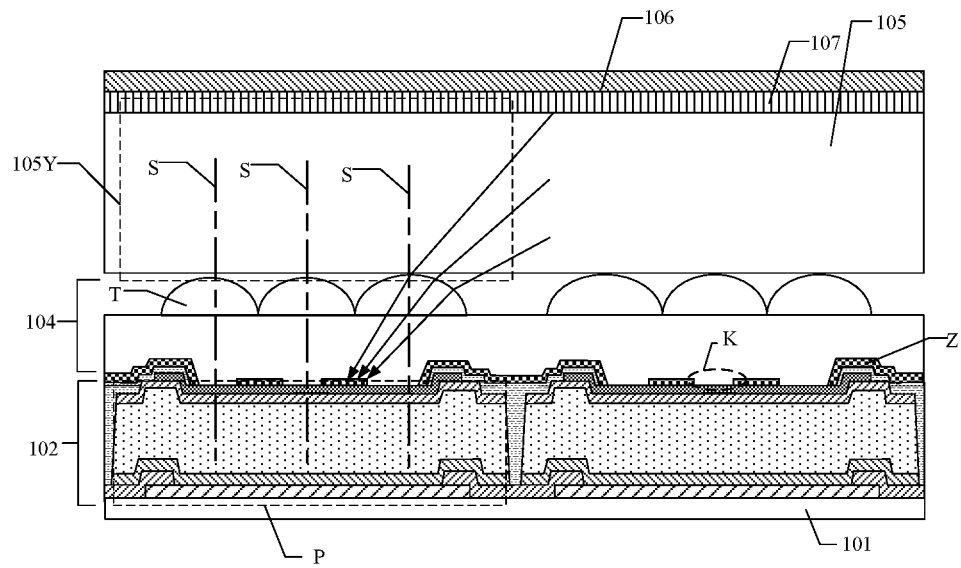
FIG. 11 is a view of a portion of a radiation image detector according to another embodiment of the present disclosure.

FIG. 11 is a view of a portion of a radiation image detector according to another embodiment of the present disclosure. In an embodiment, as shown in FIG. 11, the radiation conversion layer 105 includes an array of pixel-projection areas 105Y defined by an orthographic projection of the photosensitive pixels P. The light-collecting structure 104 is configured to guide visible light, which is from the pixel-projection areas 105Y and close to the optical axis S to the photosensitive pixels P according to the orthographic projection thereof, while blocking visible light from neighborhood pixel-projection areas. Most visible light from surroundings of the pixel-projection areas 105Y is shielded by the light-shielding layer Z. In this embodiment, the diameter of the convex lens T, the area of the opening K, the relative distance between the opening K and the convex lens T, and the thickness of the radiation conversion layer 105 can be adjusted, so as to guide the visible light, which is from the pixel-projection areas 105Y and close to the optical axis, to the opening K. In this way, an optical collimation effect of the optical collimator formed by the convex lens and the opening of the light-shielding layer can be achieved, and it can be ensured that the light collected by the photosensitive pixel P is basically the small-angle light close to the optical axis. In this way, stray light can be effectively prevented from entering the photosensitive pixel, thereby further increasing a resolution of the image.

In some optional implementation manners, the radiation image detector further includes a support structure that is pixelated and arranged between the radiation conversion layer and the substrate, in such a manner that a gap greater than or equal to 0.7 μm is formed between the light-collecting structure and the radiation conversion layer. Generally, a spectrum of visible light emitted from a cesium iodide crystal has a central wavelength of approximately 0.5 μm and a spectral range from 0.4 μm to 0.7 μm. A spectrum of visible light emitted from another widely used scintillator such as GOS (gadolinium oxysulfide) has a central wavelength of approximately 0.55 µm. In this embodiment of the present disclosure, the gap between the light-collecting structure and the radiation conversion layer is greater than or equal to 0.7 µm. Thus, the gap is larger than a length of a main wavelength of the spectrum. Moreover, the embodiment can prevent a part of the surface of the scintillator from being in direct contact with the surface of the convex lens due to unevenness of the surface of the scintillator, thereby avoiding an interference caused by multiple reflections, which would otherwise affect uniformity of the light collecting effect and the light collecting capability.

Figure 12:
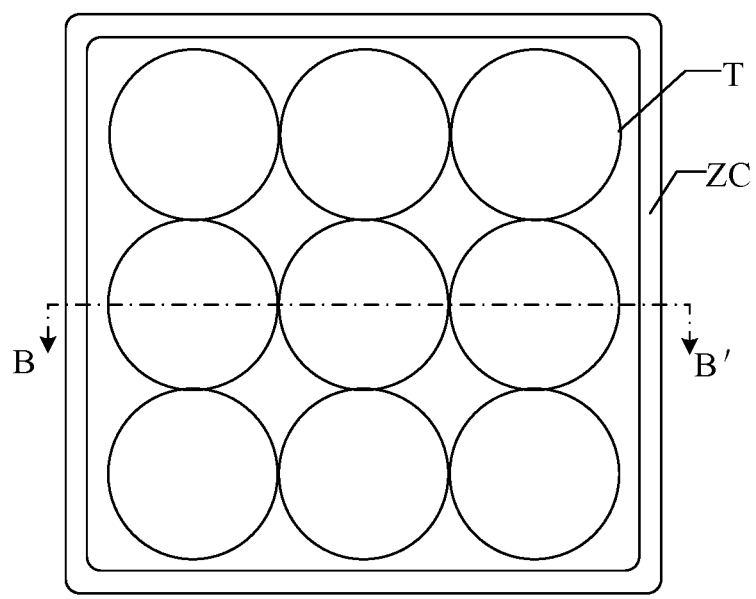
FIG. 12 is a top view of a portion of a radiation image detector according to another embodiment of the present disclosure.
Figure 13:
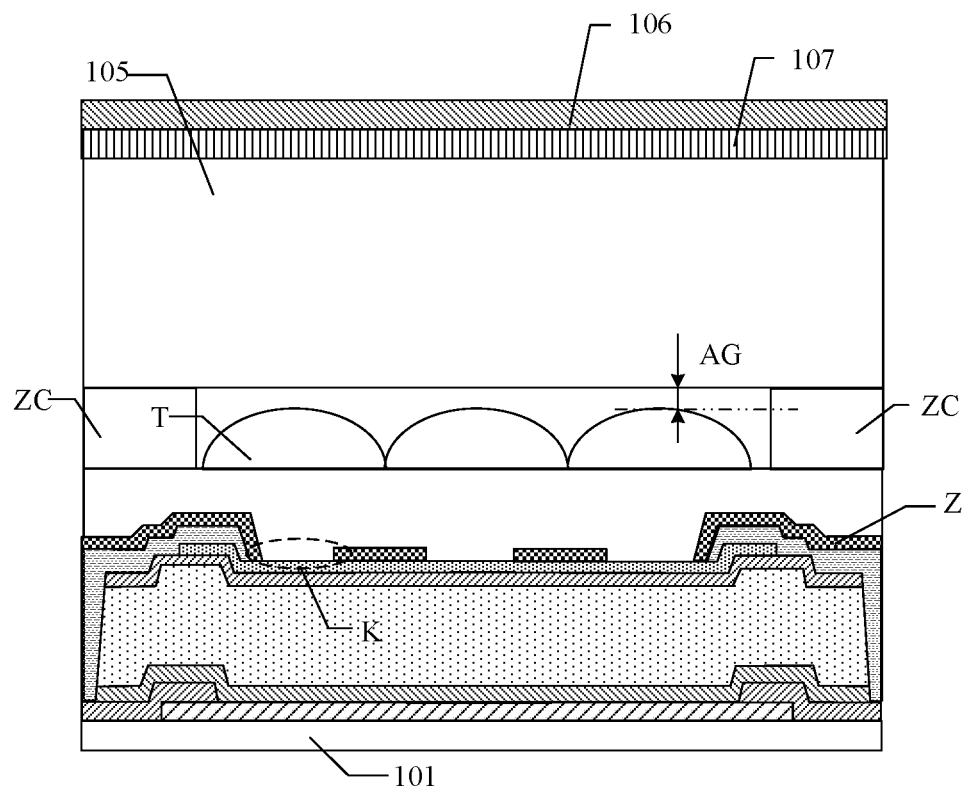
FIG. 13 is a cross-sectional view taken along line B-B' of FIG. 12.

In an implementation, the support structure includes a ring-shaped support wall that is either closed or opened, and the support wall surrounds the light-concentrating structure. This will be explained with reference to FIG. 12 and FIG. 13 in the following. FIG. 12 is a top view of a portion of a radiation image detector according to another embodiment of the present disclosure. FIG. 13 is a cross-sectional view taken along line B-B' of FIG. 12. In FIG. 12, a ring-shaped support wall ZC that is closed is illustrated. In this example, the support wall ZC surrounds the convex lens array, and supports the radiation conversion layer 105, the reflective layer 107, and the cover plate 106 disposed above it. As shown in FIG. 13, a height of a part of the support wall ZC beyond the convex lens T is AG, where AG is greater than or equal to 0.7 µm, thereby ensuring that the gap between the light-collecting structure and the radiation conversion layer 105 is larger than a length of a main wavelength of the spectrum of light emitted from the radiation conversion layer 105. This can avoid an interference caused by multiple reflections. Further, the support wall ZC may be made of an opaque black organic material, so that the support wall ZC can shield visible light emitted from the radiation conversion layer corresponding to the adjacent photosensitive pixel, thereby alleviating the crosstalk to a certain extent. FIG. 13 shows that the light-shielding structure includes one light-shielding layer Z, for illustration. Optionally, the light-shielding structure may also include two or more light-shielding layers, which will not be further illustrated in the drawings.

In an embodiment, the support structure includes a support wall that is opened, which includes at least one notch, so that fluid or gas can be discharged from the notch during a manufacturing process of the support wall or during a bonding process of the optical image detector and the scintillator assembly (a structure including the radiation conversion layer, the reflective layer, and the cover plate). This can prevent the fluid or air from staying between the light-collecting structure and the radiation conversion layer, which would otherwise affect the light collecting performance.

In an embodiment, the ring-shaped support wall, which may be either closed or opened, corresponds to a gap between two adjacent photosensitive pixels. In this way, a degree of shielding a part of visible light by the support wall can be decreased, so as to allow as much light as possible to enter the photosensitive pixel.

Figure 14:
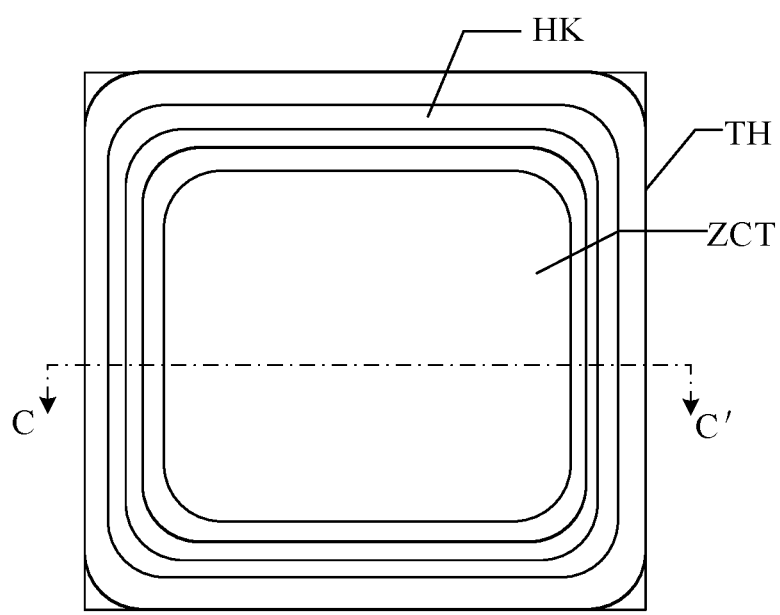
FIG. 14 is a top view of a portion of a radiation image detector according to another embodiment of the present disclosure.
Figure 15:
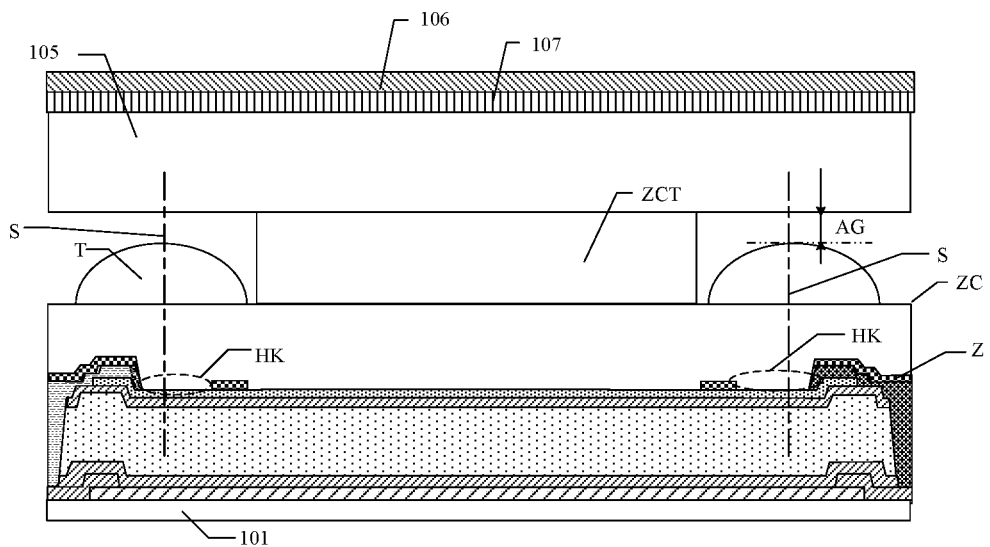
FIG. 15 is a cross-sectional view taken along line C-C' of FIG. 14.

In another embodiment, the support structure includes a support plateau, which is located in a central area of the photosensitive pixel. The convex lens includes a ring-shaped cylindrical convex lens, and the ring-shaped cylindrical convex lens surrounds the support plateau. This embodiment will be illustrated with reference to FIG. 14 and FIG. 15. FIG. 14 is a top view of a portion of a radiation image detector according to another embodiment of the present disclosure. FIG. 15 is a cross-sectional view taken along line C-C' of FIG. 14. As shown in FIG. 14, the support structure includes a support plateau ZCT, and a ring-shaped cylindrical convex lens TH surrounds the support plateau ZCT. The openings of the light-shielding layer includes a ring-shaped opening HK, and the ring-shaped cylindrical convex lens TH can guide visible light to the ring-shaped opening HK. As shown in the cross-sectional view in FIG. 15, an optical axis S of the ring-shaped cylindrical convex lens TH is perpendicular to the light-shielding layer Z and passes through the ring-shaped opening HK. Moreover, there is another opening in the light-shielding layer corresponding to the support plateau ZCT, ensuring that the visible light that is incident to the support plateau ZCT can pass through the support plateau ZCT and then enters the photosensitive pixel through the corresponding opening.

In this embodiment, the support plateau is located in the central area of the photosensitive pixel, which can support the scintillator component disposed above it. Meanwhile, large-angle light that is emitted from a scintillator disposed directly above the photosensitive pixel is more likely to arrive at the photosensitive pixel below. In this way, utilization of visible light can be improved. Moreover, the ring-shaped cylindrical convex lens is arranged to surround the support plateau. The ring-shaped cylindrical convex lens may be matched with the ring-shaped opening in such a manner that small-angle light that is emitted from a scintillator corresponding to an edge area of the photosensitive pixel can enter the photosensitive pixel through the ring-shaped opening, and large-angle light that is emitted from a scintillator corresponding to an adjacent pixel will be shielded by the light-shielding layer. Therefore, the crosstalk can be alleviated, and a resolution of the image can be increased. The small-angle light is collected as much as possible in the edge area of the photosensitive pixel, and the large-angle light that is emitted from the corresponding area of the adjacent pixel is shielded. As much light as possible is collected in the central area, including some large-angle light. In this way, detective quantum efficiencies at a low spatial frequency, a medium spatial frequency, and a high spatial frequency of the image detection system can be increased.

In an embodiment, an anti-reflective coating is formed on a surface of the support plateau ZCT. A refractive index of the anti-reflective film is between the refractive index of the radiation conversion layer and a refractive index of a material of the support plateau, so as to increase light transmittance of the support plateau.

In the embodiment corresponding to FIG. 14 and FIG. 15, a dimension of the support plateau can be optimized based on the thickness of the radiation conversion layer. Specifically, when the thickness of the radiation conversion layer is larger, a risk of lateral diffusion of visible light emitted from the scintillator is higher, that is, a probability of light entering the adjacent photosensitive pixel is higher. In this case, the dimension of the support plateau can be accordingly set to be smaller. When the thickness of the radiation conversion layer is smaller, the risk of lateral diffusion of light is lower, and the dimension of the support plateau can be accordingly set to be larger.

With further reference to FIG. 15, a height of a part of the support plateau ZCT beyond the ring-shaped cylindrical convex lens TH is AG, where AG is greater than or equal to 0.7 µm, thereby ensuring that the gap between the light-collecting structure and the radiation conversion layer 105 is larger than the length of the main wavelength of the spectrum of the light emitted from the radiation conversion layer.

This can avoid an interference caused by multiple reflections and a Newton's ring caused by multiple light interferences in the air gap.

Figure 16:
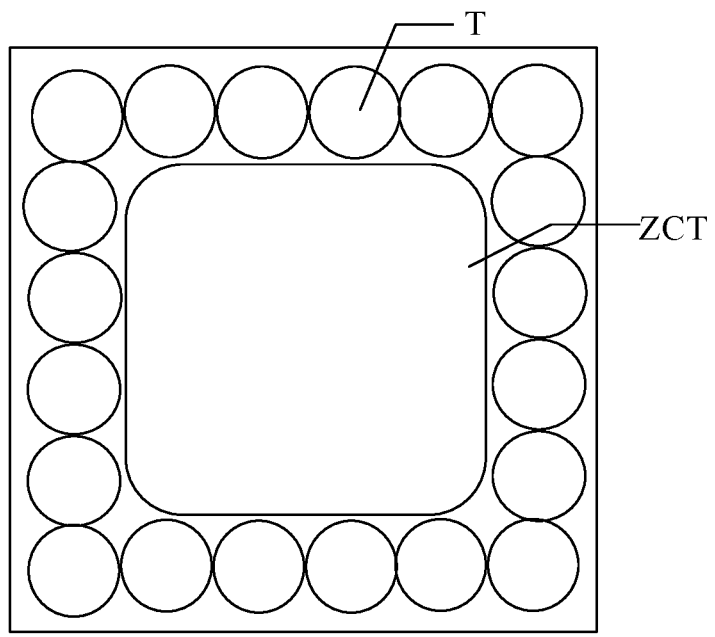
FIG. 16 is a top view of a portion of a radiation image detector according to another embodiment of the present disclosure.

FIG. 16 is a top view of a portion of a radiation image detector according to another embodiment of the present disclosure. Similar to the embodiment corresponding to FIG. 14 and FIG. 15, a support structure shown in FIG. 16 includes the support plateau ZCT, which is located in the central area of the photosensitive pixel. A difference from the embodiment corresponding to FIG. 14 and FIG. 15 lies in that, in the embodiment as shown in FIG. 16, multiple convex lenses T are arranged around the support plateau ZCT. In this case, one opening in the light-shielding layer may be provided under each convex lens T, or one ring-shaped opening corresponding to multiple convex lenses T may be provided in the light-shielding layer. This embodiment can also allow as much as possible small-angle light to be collected in the edge area of the photosensitive pixel and the large-angle light that is emitted from the corresponding area of the adjacent pixel to be shielded. Moreover, as much light as possible light can be collected in the central area, including some large-angle light. In this way, detective quantum efficiencies at a low spatial frequency, a medium spatial frequency, and a high spatial frequency of the image detection system can be increased.

Figure 17:
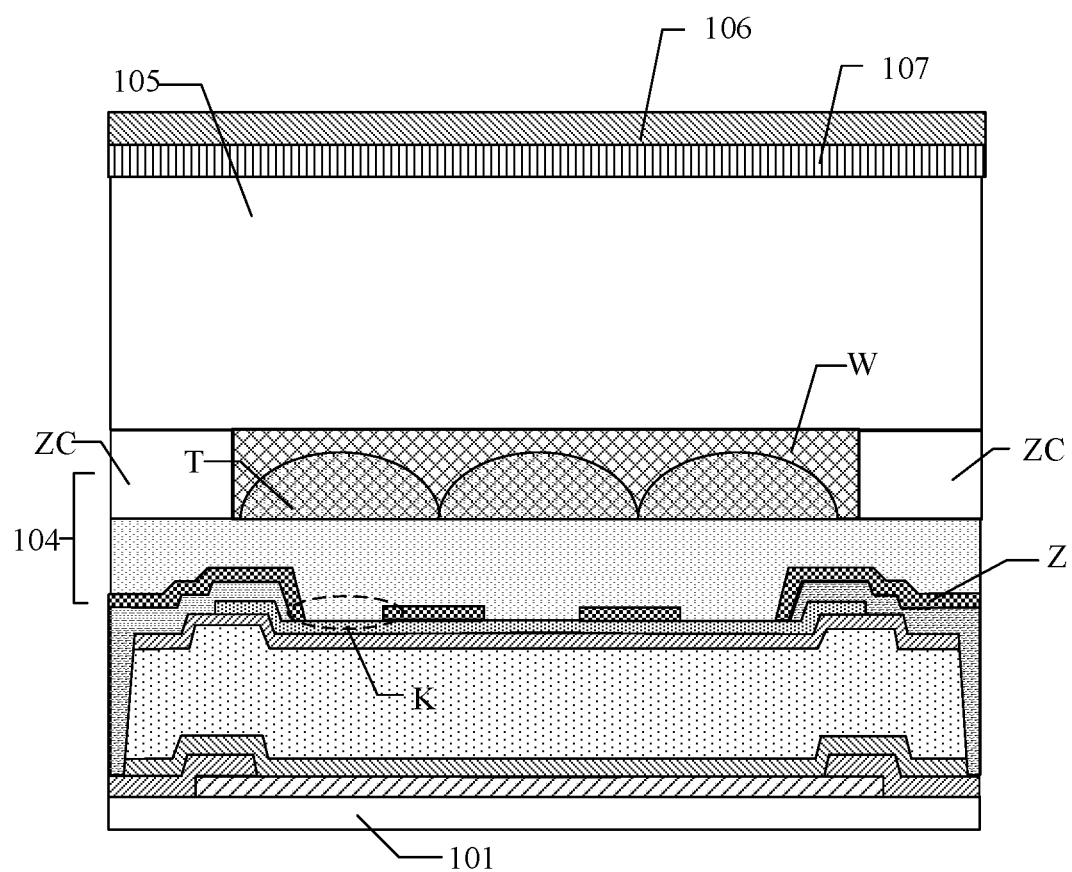
FIG. 17 is a view of a radiation image detector according to another embodiment of the present disclosure.

In an embodiment, the radiation image detector further includes a filler, which fills the gap between the radiation conversion layer and the light-collecting structure. As an example, this embodiment will be illustrated by filling the filler into the structure shown in FIG. 13. FIG. 17 is a view of a radiation image detector according to another embodiment of the present disclosure. A filler W fills the gap between the radiation conversion layer 105 and the light-collecting structure 104, and a refractive index of the filler is smaller than the refractive index of radiation conversion layer 105 and smaller than the refractive index of light-collecting structure 104. The filler W can prevent air from staying between the radiation conversion layer and the light-collecting structure, which would otherwise result in that visible light is refracted at multiple interfaces when being emitted from the radiation conversion layer to the light-collecting structure to cause light loss. Meanwhile, the filler can also allow harmful gas that may be released to be sealed at a side of the light-collecting structure, thereby avoiding an affection on stability of the material of the scintillator.

It should be noted that the scheme for filling the gap between the radiation conversion layer and the light-collecting structure is also applicable to the embodiments corresponding to FIG. 14 and FIG. 16 described above.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A radiation image detector, comprising:
   a substrate;
   a continued radiation conversion layer configured to convert radiation into visible light;
   an optical image detector on the substrate and between the radiation conversion layer and the substrate, wherein the optical image detector comprises an array of photosensitive pixels;
   a light-shielding structure located on a side of the plurality of photosensitive pixels facing away from the substrate, wherein the light-shielding structure has a plurality of openings to allow the visible light to reach the photosensitive pixels; and
   a light-collecting structure located between the radiation conversion layer and the light-shielding structure and comprising a plurality of convex lenses, wherein each convex lens of the plurality of convex lenses has its optical axis perpendicular to the light-shielding structure and passing through one of the plurality of openings.

2. The radiation image detector according to claim 1, wherein the light-shielding structure comprises a plurality of light-shielding layers overlapped in sequence on the photosensitive pixels, and
   along the optical axes of the convex lens and in a light incident direction, the plurality of openings on the light-shielding layers become smaller and smaller.

3. The radiation image detector according to claim 1, wherein the continued radiation conversion layer comprises an array of pixel-projection areas, defined by an orthographic projection of the array of photosensitive pixels; and
   wherein the light-collecting structure and the light-shielding structure are configured to guide the visible light from the pixel-projection areas to the photosensitive pixels according to the orthographic projection thereof, while blocking the visible light from neighborhood pixel-projection areas.

4. The radiation image detector according to claim 1, further comprising a support structure arranged between the radiation conversion layer and the substrate in such a manner that a gap greater than or equal to 0.7 μm is formed between the light-collecting structure and the radiation conversion layer.

5. The radiation image detector according to claim 4, wherein the support structure comprises a ring-shaped support wall that is either closed or opened, and the ring-shaped support wall surrounds the light-collecting structure.

6. The radiation image detector according to claim 4,
   wherein the support structure comprises a support plateau located in a central area of one of the photosensitive pixels;
   wherein the plurality of convex lenses comprises a ring-shaped cylindrical convex lens surrounding the support plateau; and
   wherein the plurality of openings comprises a ring-shaped opening, and an optical axis of the ring-shaped cylindrical convex lens is perpendicular to the light-shielding structure and passes through the ring-shaped opening.

7. The radiation image detector according to claim 1, further comprising an anti-reflective coating on each convex lens to increase light transmittance of the convex lens.

8. The radiation image detector according to claim 1, wherein the light-shielding structure comprises at least one opaque metal layer, and the at least one opaque metal layer comprises a chromium layer or a chromium layer covered by chromium oxide; and wherein at least one of the at least one opaque metal layer is configured to provide a driving voltage to the photosensitive pixels.

9. The radiation image detector according to claim 1, further comprising a filler filling a gap between the radiation conversion layer and the light-collecting structure, wherein a refractive index of the filler is smaller than a refractive index of the radiation conversion layer, and the refractive index of the filler is smaller than a refractive index of the light-collecting structure.

\* \* \* \* \*